US008760827B2

(12) United States Patent
Campi, Jr. et al.

(10) Patent No.: US 8,760,827 B2
(45) Date of Patent: Jun. 24, 2014

(54) ROBUST ESD PROTECTION CIRCUIT, METHOD AND DESIGN STRUCTURE FOR TOLERANT AND FAILSAFE DESIGNS

(75) Inventors: John B. Campi, Jr., Westford, VT (US); Shunhua T. Chang, South Burlington, VT (US); Kiran V. Chatty, Williston, VT (US); Robert J. Gauthier, Jr., Hinesburg, VT (US); Junjun Li, Williston, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1150 days.

(21) Appl. No.: 12/424,169

(22) Filed: Apr. 15, 2009

(65) Prior Publication Data

US 2010/0265622 A1    Oct. 21, 2010

(51) Int. Cl.
*H02H 3/22* (2006.01)

(52) U.S. Cl.
USPC ............................................ 361/56; 361/111

(58) Field of Classification Search
USPC .................. 361/56, 91.1, 91.5, 111
See application file for complete search history.

(56) References Cited

U.S. PATENT DOCUMENTS

| 4,686,383 | A | * | 8/1987 | Croft ............................. 327/198 |
| 4,782,250 | A | * | 11/1988 | Adams et al. .................. 327/108 |
| 4,855,620 | A | * | 8/1989 | Duvvury et al. ............... 326/119 |
| 5,450,267 | A |   | 9/1995 | Diaz et al. |
| 5,473,500 | A | * | 12/1995 | Payne et al. .................... 361/111 |
| 5,838,146 | A | * | 11/1998 | Singer ............................ 323/270 |
| 5,929,667 | A | * | 7/1999 | Abadeer et al. ................ 327/112 |
| 5,930,094 | A |   | 7/1999 | Amerasekera et al. |
| 5,933,027 | A | * | 8/1999 | Morris et al. .................... 326/81 |
| 5,973,511 | A | * | 10/1999 | Hsia et al. ........................ 326/81 |
| 6,181,193 | B1 | * | 1/2001 | Coughlin, Jr. ................. 327/534 |
| 6,414,532 | B1 |   | 7/2002 | Su et al. |
| 6,552,583 | B1 |   | 4/2003 | Kwong |
| 6,781,805 | B1 | * | 8/2004 | Urakawa ........................ 361/56 |
| 6,927,957 | B1 |   | 8/2005 | Bakulin et al. |
| 7,068,482 | B2 |   | 6/2006 | Chen |
| 7,098,513 | B2 | * | 8/2006 | Chatty et al. ................... 257/382 |
| 7,243,317 | B2 | * | 7/2007 | Wang et al. .................... 716/112 |
| 7,724,485 | B2 | * | 5/2010 | Worley et al. ................... 361/56 |
| 7,782,580 | B2 | * | 8/2010 | Gauthier et al. ................ 361/56 |
| 7,804,669 | B2 | * | 9/2010 | Worley ............................ 361/56 |
| 7,825,475 | B2 | * | 11/2010 | Chatty et al. ................... 257/358 |
| 8,010,927 | B2 | * | 8/2011 | Gauthier et al. ............... 716/120 |
| 2003/0007298 | A1 |   | 1/2003 | Chang et al. |

(Continued)

FOREIGN PATENT DOCUMENTS

| EP | 1638146 A2 | 3/2006 |
| WO | 9519657 | 7/1995 |

OTHER PUBLICATIONS

International Search Report and Written Opinion dated Oct. 20, 2010 in PCT Application No. PCT/US2010/027774.

(Continued)

*Primary Examiner* — Danny Nguyen
(74) *Attorney, Agent, or Firm* — Anthony Canale; Roberts Mlotkowski Safran & Cole, P.C.

(57) ABSTRACT

A robust ESD protection circuit, method and design structure for tolerant and failsafe designs are disclosed. A circuit includes a middle junction control circuit that turns off a top NFET of a stacked NFET electrostatic discharge (ESD) protection circuit during an ESD event.

25 Claims, 6 Drawing Sheets

(56) References Cited

U.S. PATENT DOCUMENTS

| | | |
|---|---|---|
| 2005/0237681 A1 | 10/2005 | Chen |
| 2006/0087788 A1* | 4/2006 | Gibet et al. ............... 361/100 |
| 2006/0250735 A1 | 11/2006 | Kwon |
| 2007/0097570 A1 | 5/2007 | Chatty et al. |
| 2008/0049365 A1 | 2/2008 | Worley et al. |
| 2008/0055805 A1* | 3/2008 | Pong et al. ............... 361/56 |
| 2008/0259511 A1 | 10/2008 | Worley |
| 2009/0267641 A1* | 10/2009 | Chen et al. ............... 326/30 |
| 2009/0268359 A1 | 10/2009 | Chatty et al. |
| 2010/0246076 A1 | 9/2010 | Campi, Jr. et al. |

OTHER PUBLICATIONS

Anderson W. R., et al., "ESD protection for mixed-voltage I/O using NMOS transistors stacked in a cascode configuration", EOS/ESD Symposium, Jan. 1, 1998, pp. 54-62.

European Search Report dated Mar. 5, 2012 for corresponding European Application No. EP 10 76 4802.

\* cited by examiner

VG=VPAD x R2/(R1+R2)

US 8,760,827 B2

ROBUST ESD PROTECTION CIRCUIT, METHOD AND DESIGN STRUCTURE FOR TOLERANT AND FAILSAFE DESIGNS

FIELD OF THE INVENTION

The invention relates to electrostatic discharge (ESD) protection of integrated circuits, and more particularly, to a robust ESD protection circuit, method, and design structure for tolerant and failsafe designs.

BACKGROUND

An electrostatic discharge (ESD) event may cause extremely high currents to flow through the semiconductor devices in a chip, causing device junctions, gate oxides, and other adjacent structures to be permanently damaged. Conventional methods and structures may be used to provide ESD protection during chip manufacture, including during various fabrication, testing, and packaging steps. However, ESD protection in high voltage applications, such as for example, in the user environment and field use, is still an issue of concern.

With the shrinking of device size through technology scaling, it becomes increasingly more challenging to achieve adequate protection against electrostatic discharge (ESD) for CMOS integrated circuits. Technology scaling has brought with it very low breakdown voltages in CMOS circuits. For example, in the 90 nm node, these breakdown voltages fall below 10V for transient stresses of short duration as it typically occurs in a Charged Device Model (CDM) discharge. At the same time, advances in IC technology have increased the circuit density which has led to a corresponding increase in the number of pads for off-chip connections, i.e., for chip input/outputs (I/Os) and for supplying power and ground to the chip.

Moreover, while gate oxide is getting thinner and more difficult to protect, the compatibility requirement to legacy devices remains unchanged. This limits the design window to an even smaller range. Compatibility with legacy devices requires that chips utilizing current technology offerings (e.g., 2.5V devices) communicate with older chips that use older technology (e.g., 5V devices).

In general, newer, lower-voltage ESD NFETs can no be used to protect older, higher voltage tolerant or fail-safe I/O designs. In such cases, stacked NFETs are required to make legacy-compatible designs while handling the higher voltage across the device to be protected. However, the practice of stacking 2.5V ESD NFETs to handle 5V operations (e.g., when interacting with legacy devices) suffers from reliability problems and insufficient ESD protection levels. Moreover, traditional silicided NFETs are not robust against ESD discharge and require significantly more chip area on resistance ballasting in order to handle the ESD current safely. As such, backward-compatibility (e.g., 5V-tolerant I/Os) and ESD-ruggedness in consumer electronics requires new solutions for designs manufactured in sub-micron technologies.

Accordingly, there exists a need in the art to overcome the deficiencies and limitations described hereinabove.

SUMMARY

In an aspect of the invention, a circuit comprises a middle junction control circuit that turns off a top NFET of a stacked NFET electrostatic discharge (ESD) protection circuit during an ESD event.

In another aspect of the invention, a circuit comprises a stacked NFET ESD protection circuit comprising a top NFET and a bottom NFET arranged in series between an I/O pad and ground. A middle junction control circuit is also used to turn off the top NFET during an ESD event.

In another aspect of the invention, a method of providing electrostatic discharge protection, comprising during an ESD event, turning off a top NFET of a stacked NFET ESD protection circuit by biasing a middle junction between the top NFET and a bottom NFET to substantially a same voltage as a gate of the top NFET.

In another aspect of the invention, a design structure embodied in a machine readable medium for designing, manufacturing, or testing an integrated circuit is provided. The design structure comprises the structures and/or methods of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to ESD protection of integrated circuits, and more particularly, to robust 2.5V ESD protection structures and methods for 5V-tolerant and failsafe designs. In embodiments, a middle junction control circuit is provided to control the state of at least one MOSFET of a stacked MOSFET protection circuit during an ESD event. Particularly, during normal operation (e.g., operation other than during an ESD event), the middle junction control circuit permits the top MOSFET (e.g., the MOSFET closer to the pad) to be at a potential close to digital Vdd (e.g., DVdd) and permits the bottom MOSFET (e.g., the MOSFET closer to ground) to be tied to ground. On the other hand, during an ESD event, the middle junction control circuit causes the top gate to be tuned off, thereby providing enhanced ESD performance. Optionally, the middle junction control circuit may also control the bottom gate during an ESD event to be partially turned on, which further enhances ESD performance for the stacked gate circuit. Additionally, one or more diodes may be provided in the middle junction control circuit to fine tune the voltage supplied during an ESD event. In this manner, implementations of the invention provide enhanced ESD performance for stacked MOSFET protection circuits.

Figure 1:
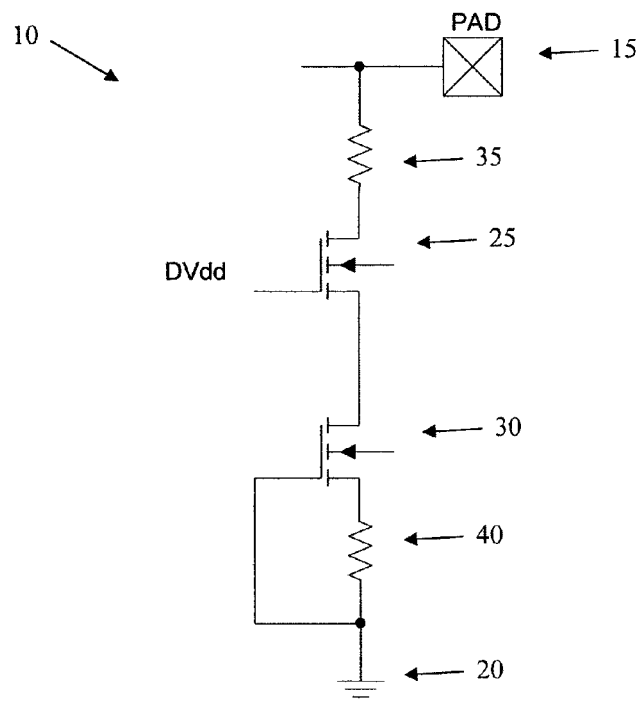
FIG. 1 shows a stacked MOSFET protection circuit.

FIG. 1 shows a stacked MOSFET protection circuit 10. The invention is described herein with respect to stacked MOSFET protection circuits comprising N-channel MOSFETs (NFETs); however, the invention is not limited to use with NFETs. Still referring to FIG. 1, the stacked MOSFET protection circuit 10 comprises an I/O pad 15, ground 20, top NFET 25, and bottom NFET 30. A top resistor 35 is arranged between the pad 15 and the top NFET 25, and a bottom resistor 40 is arranged between the bottom NFET 30 and ground 20. The serial arrangement of the pad 15, top resistor 35, and top NFET 25, and of the bottom NFET 30, bottom resistor 40, and ground 20 is known as a stacked MOSFET protection circuit (and can also be referred to as a stacked NFET protection circuit, a stacked NFET ESD protection circuit, etc.). For 5V operation, each of the top NFET 25 and bottom NFET 30 is a 2.5V NFET, although the invention is not limited to devices having this particular voltage, and other devices designed for different voltages may be used within the scope of the invention.

As depicted in FIG. 1, the gate of the top NFET 25 is tied to digital Vdd (DVdd), which corresponds to an external logic power supply. However, the on/off states of the respective NFETs 25, 30 are not controlled during an ESD event. In the arrangement depicted, the stacked MOSFET protection circuit 10 works well during normal circuit operation for 5V tolerant designs (e.g., when the DVdd is powered up to the operational voltage), but does not perform well for 5V failsafe designs (e.g., when DVdd might be unpowered and may be as low as 0V). Moreover, the stacked MOSFET protection circuit 10 has low ESD performance when the output stage shares similar topology as the ESD protection device.

Figure 2:
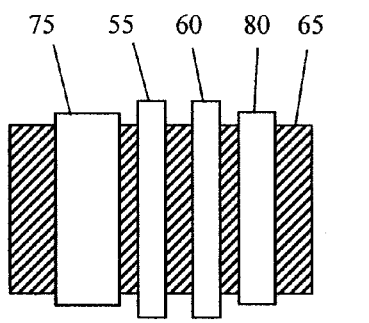
FIGS. 2-4 show semiconductor structures of stacked MOSFET protection circuits.
Figure 3:
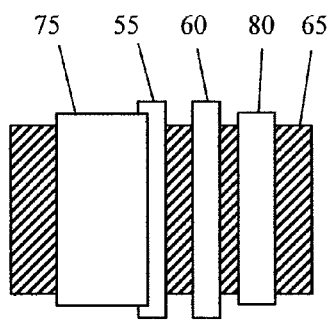
Figure 4:
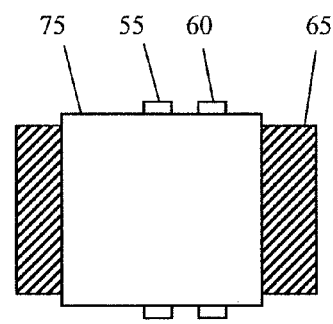

FIGS. 2-4 show top views of typical configurations of a semiconductor structure corresponding to the stacked MOSFET protection circuit 10 of FIG. 1. In FIGS. 2-4, gate 55 corresponds to the gate of top NFET 25, and gate 60 corresponds to the gate of bottom NFET 30. Active area 65 is the active area for the transistor. Moreover, first silicide block 75 corresponds to top resistor 35, and second silicide block 80 corresponds to bottom resistor 40.

The gate-silicided (GS) structure depicted in FIG. 2 is the most common design configuration for a stacked FET. FIG. 3 shows a partial gate-non-silicided (partial GNS) structure in which the first silicide block 75 extends partially over the gate 55. FIG. 4 shows a GNS structure in which the first and second silicide blocks 75, 80 cover the gates 55, 60 and the space between the gates 55, 60 (e.g., the middle junction). The partial GNS structure of FIG. 3 and the GNS structure of FIG. 4 provide improved ESD performance compared to the GS structure of FIG. 2. However, the presence of the silicide block over the gate(s) disadvantageously increases the gate resistance, which decreases the overall device speed. Therefore, silicide blocking the middle junction is not an attractive option for the self-protect configuration of the circuit 10 of FIG. 1.

It has been recognized that there are disadvantageous trade-offs between ESD performance and device speed in chips having implementations of the configurations shown in FIGS. 1-4. Accordingly, aspects of the invention include a test circuit 100, shown in FIG. 5, for examining the effects of controlling the on/off state of the NFETs in a stacked NFET protection circuit. The test circuit 100 comprises stacked NFETs with a resistive network connecting to different gates of the stacked NFETs. More specifically, test circuit 100 includes a pad 115, ground 120, top NFET 125, bottom NFET 130, top drain resistor 135, and bottom source resistor 140, which may be similar to the pad 15, ground 20, NFETs 25, 30, and resistors 35, 40 described above with respect to FIG. 1.

The test circuit 100 also includes a voltage divider 150 comprising a first resistor 155 having a resistance value of R1, and a second resistor 160 having a resistance of R2. The test circuit 100 also includes a switch 165. The voltage divider 150 and switch 165 operate to apply a portion of the pad voltage (e.g., $V_{PAD}$) to a respective one of the NFETs 125 (or 130), while the other respective one of the NFETs 130 (or 125) is tied to ground. For example, the voltage applied to one of the gates is equal to the pad voltage multiplied by R2/(R1+R2), while the other gate is tied to ground. By applying a test Human Body Model (HBM) voltage to the pad 115, the test circuit 100 can be used to evaluate the effect of controlling the respective on/off state of the NFETs 125, 130 on the ESD performance of the circuit.

Figure 5:
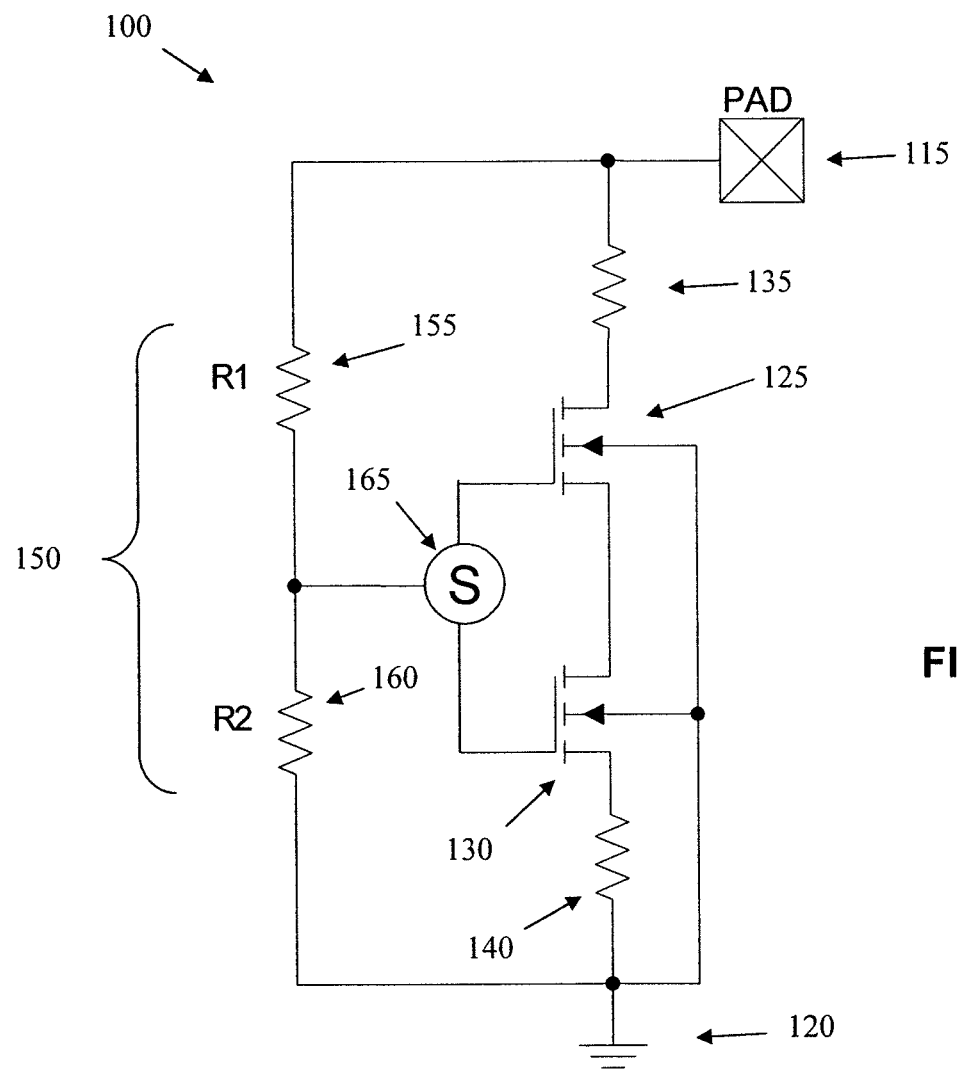
FIG. 5 shows a test structure for a stacked MOSFET protection circuit in accordance with aspects of the invention.
Figure 6:
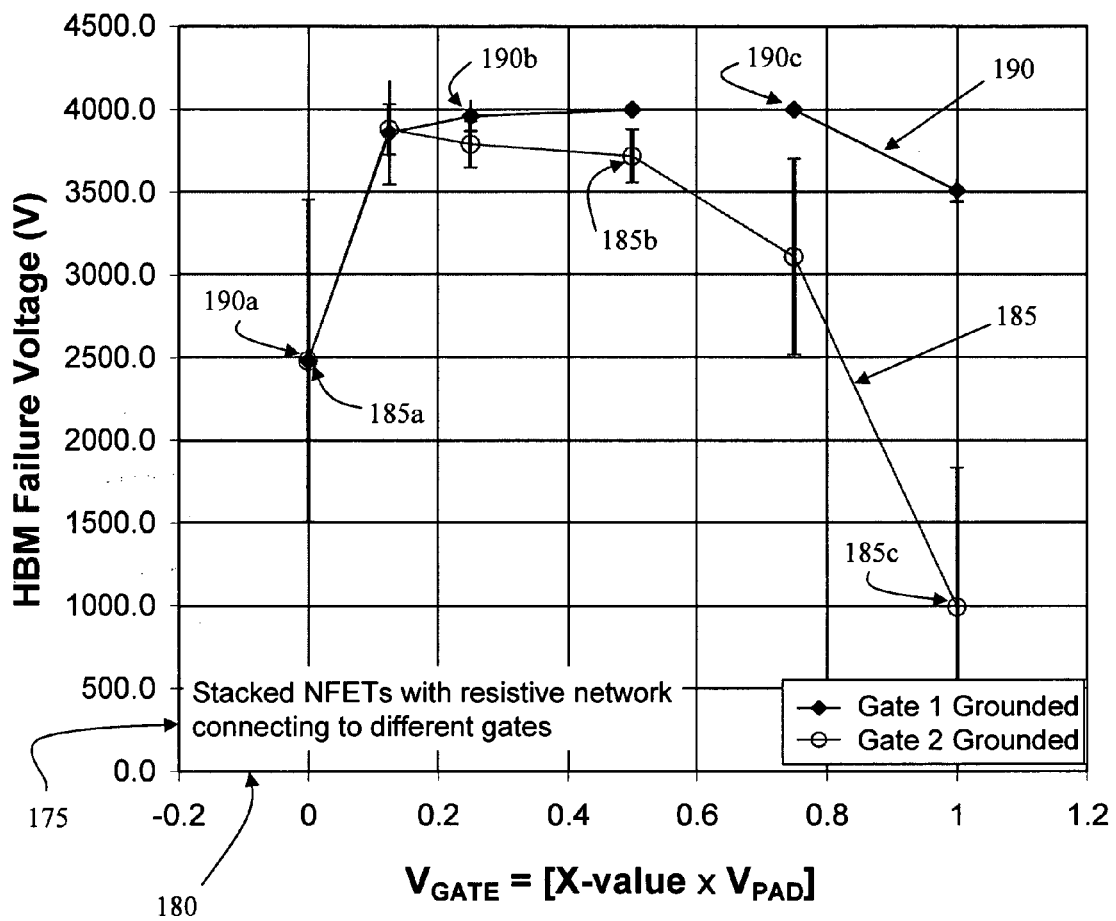
FIG. 6 shows data obtained using the test structure of FIG. 5 in accordance with aspects of the invention.

FIG. 6 shows a graph of data that was empirically obtained using test circuit 100 from FIG. 5. The first axis 175 represents the voltage at which the test circuit 100 failed, and corresponds to a value of the voltage applied to the pad 115 (e.g., $V_{PAD}$). The second axis 180 represents the proportion (e.g., from 0.0 to 1.0) of the pad voltage ($V_{PAD}$) that is applied to the gate of one of the NFETs 125, 130 via the voltage divider 150 and switch 165.

The first data plot 185 corresponds to the bottom gate (e.g., bottom NFET 130) being grounded, while the top gate (e.g., top NFET 125) sees a portion of the pad voltage ($V_{PAD}$). So, for example, as indicated by data point 185a, the test circuit 100 failed at a pad voltage of about 2500V when the bottom gate was grounded and the top gate saw 0% of the pad voltage. Also, as indicated by data point 185b, the test circuit 100 failed at about 3700V when the bottom gate was grounded and the top gate saw about 50% of the pad voltage. Additionally, as indicated by data point 185c, the test circuit 100 failed at about 1000V when the bottom gate was grounded and the top gate saw about 100% of the pad voltage.

The second data plot 190 corresponds to the top gate (e.g., top NFET 125) being grounded, while a portion of the pad voltage ($V_{PAD}$) is applied to the bottom gate (e.g., bottom NFET 130). So, for example, as indicated by data point 190a, the test circuit 100 failed at a pad voltage of about 2500V when the top gate was grounded and the bottom gate saw 0% of the pad voltage. Also, as indicated by data point 190b, the test circuit 100 failed at about 3900V when the top gate was grounded and the bottom gate saw about 25% of the pad voltage. Additionally, as indicated by data point 190c, the test circuit 100 failed at about 4000V when the top gate was grounded and the bottom gate saw about 75% of the pad voltage.

From the experimental data shown in FIG. 6, it has been determined herein that for enhanced ESD performance, the top NFET should be turned off (e.g., grounded) during an ESD event. For even further enhanced ESD performance, the top NFET should be turned off and the bottom NFET should be partially turned on during the ESD event. Moreover, for normal circuit operation (e.g., non-ESD operation), the top gate should be at a potential close to DVdd, while the bottom gate is tied to ground. These preferred operational states were not previously known.

Figure 7:
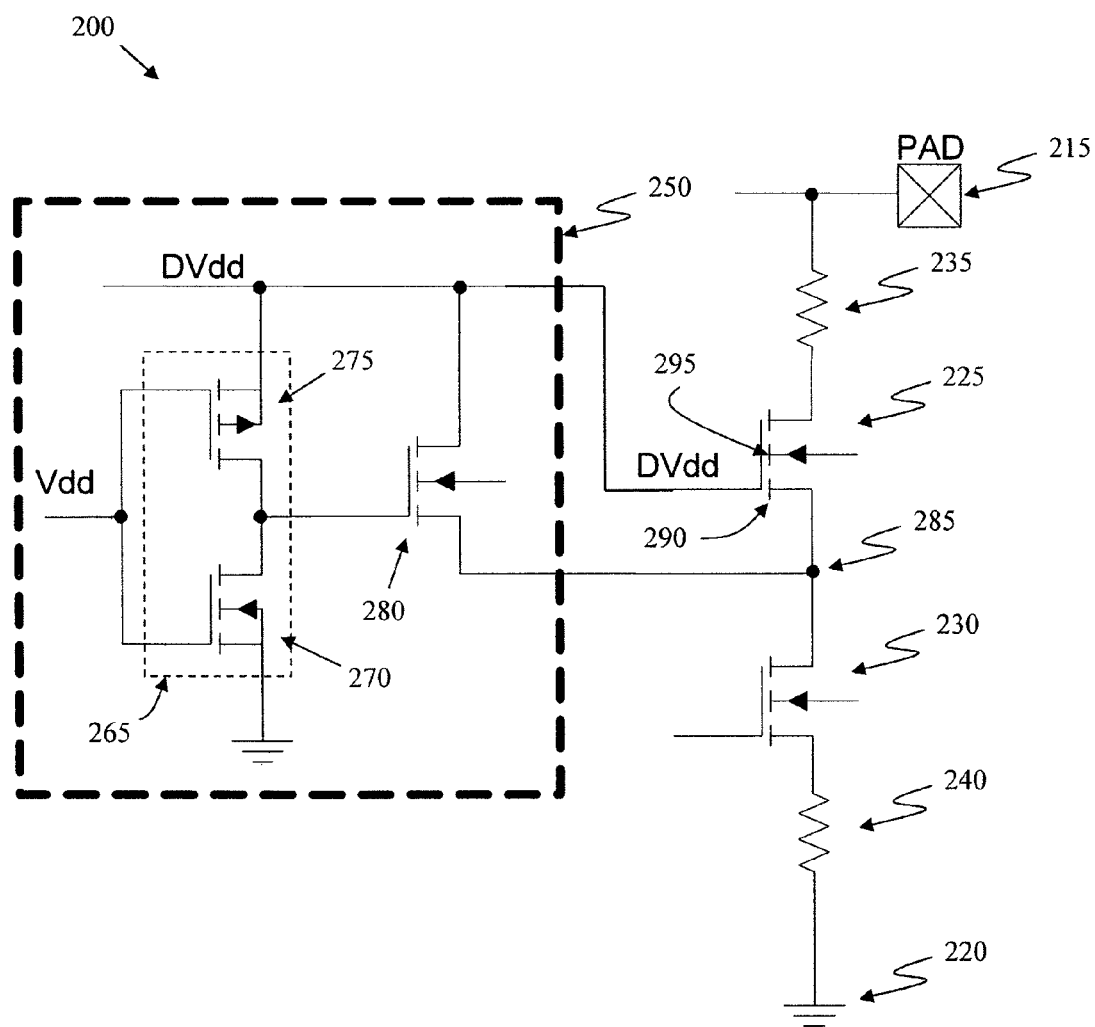
FIGS. 7-9 show ESD protection circuits comprising a middle junction control circuit in accordance with aspects of the invention.

FIG. 7 shows a protection circuit 200 according to aspects of the invention. In embodiments, the protection circuit 200 comprises a pad 215, ground 220, top NFET 225, bottom NFET 230, top resistor 235, and bottom resistor 240, which may be similar to the pad 15, ground 20, NFETs 25, 30, and resistors 35, 40 described above with respect to FIG. 1. In embodiments, the protection circuit 200 also comprises a middle junction control circuit 250 that operates to control the on/off state of the top NFET 225 during an ESD event. More specifically, as described in greater detail herein, the middle junction control circuit 250 operates to turn the top NFET 225 off during an ESD event, thus permitting the top NFET 225 to be at a potential close to DVdd and the bottom NFET 240 tied to ground during normal operation. In this manner, the protection circuit 200 provides enhanced ESD performance when compared to a conventional stacked NFET protection circuit.

In embodiments, the middle junction control circuit 250 comprises a connection to Vdd (e.g., an internal logic power supply, analog Vdd, etc.) and DVdd (e.g., an digital I/O connection power supply.). In accordance with aspects of the invention, the Vdd net voltage may be used to determine when an ESD event is occurring. For example, during an ESD discharge to the PAD pin, Vdd typically has a value of zero (e.g., low, ground, etc.), while during normal operation Vdd typically has a value of high (e.g., nominal voltage for the device). In embodiments, a level shifter (not shown) may be used to adjust the level of Vdd relative to DVdd. The use of a level shifter is known in the art such that further explanation is not believed necessary.

In accordance with aspects of the invention, the middle junction control circuit 250 comprises an inverter 265. In embodiments, the Vdd voltage is applied to the input of the inverter 265. The inverter 265 comprises, for example, an NFET 270 and a PFET 275. The output of the inverter 265 is applied to a gate of a control switch 280. In embodiments, the control switch 280 is an NFET that closes when a high voltage (e.g., nominal voltage) is applied to the gate of the control switch 280, and opens when a low voltage (e.g., zero) is applied to the gate of the control switch 280. An input of the control switch 280 is tied to DVdd, while an output of the control switch 280 is connected to the middle junction 285 located between the top NFET 225 and bottom NFET 230 of the protection circuit 200. Accordingly, when the control switch 280 is closed, the middle junction 285 is biased to DVdd. In embodiments, the middle junction 285 is electrically connected to the source connection 290 of the top NFET 225, and DVdd is connected to the gate 295 of the top NFET 225.

In operation, during an ESD event the DVdd net is partially charged up from a diodes and/or parasitic capacitance. As the value of Vdd is low (e.g., zero) during an ESD event, the input of the inverter is also low, which results in the output of the inverter 265 being high, which closes the control switch 280. When the control switch 280 is closed, the middle junction 285 (and, therefore, the top NFET source connection 290) is biased to substantially the same voltage (e.g., DVdd) as the top NFET gate 295. This turns off the top NFET 225, which is the preferred state according to the data in FIG. 6. When the top NFET 225 is turned off during an ESD event, the ESD voltage is conducted through the top NFET 225 via a parasitic bipolar junction transistor in accordance with the well known avalanche breakdown and snapback phenomena.

On the other hand, during normal operation (e.g., not during an ESD event), the value of Vdd is high (e.g., nominal voltage), which causes the output of the inverter 265 to be low (e.g., zero), which opens the control switch 280. With the control switch 280 open, the middle junction control circuit 250 does not bias the middle junction 285. Instead, during normal operation, the middle junction 285 is permitted to float (e.g., is not biased to DVdd by the middle junction control circuit 250). Also during normal operation, the gate of the top NFET 225 is biased to DVdd, while the bottom NFET 240 is tied to ground 220.

Figure 8:
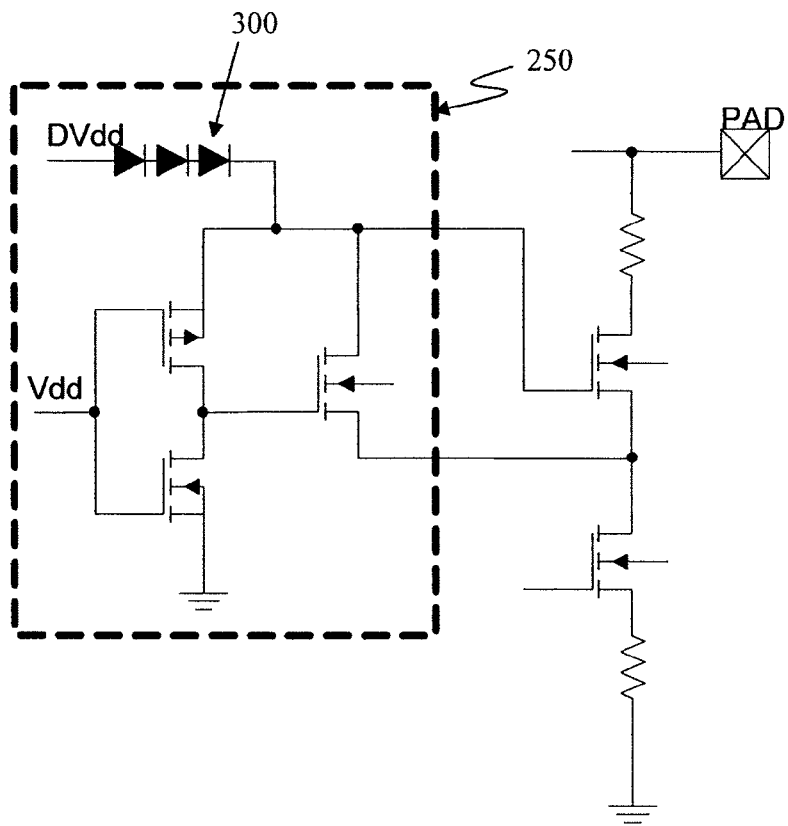

In embodiments, one or more diodes 300 may be inserted between the DVdd source and the middle junction control circuit 250, as depicted in FIG. 8. The one or more diodes 300 are optionally used to fine tune the voltage supplied to the middle junction control circuit 250 during an ESD event. The number and/or size (e.g., magnitude of voltage drop) of the one or more diodes 300 may be selected based on desired end use of the system. For example, three diodes 300 are shown, although the invention is not limited to this number, and any number of diodes 300 may be used.

Figure 9:
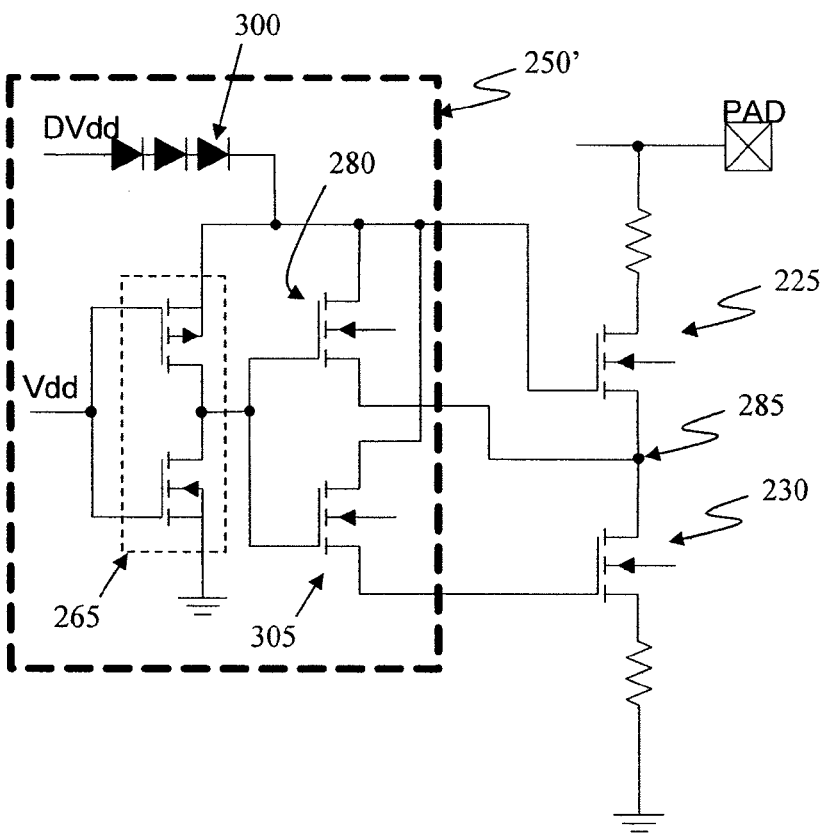

FIG. 9 shows an arrangement of the middle junction control circuit 250' that is used to control the on/off state of both the top NFET 225 and the bottom NFET 230 during an ESD event. In FIG. 9, like reference numerals refer to the same elements discussed above with respect to FIG. 7. In embodiments, the middle junction control circuit 250' includes an additional switch 305 that is connected between the output of the inverter 265 and the gate of the bottom NFET 230. The switch 305 may be similar to control switch 280 described above.

Accordingly, when Vdd is low during an ESD event, the output of the inverter 265 is high, which closes switches 280 and 305. When control switch 280 is closed, the middle junction 285 is biased to the same voltage (e.g., DVdd) as the gate of the top NFET 225, thereby turning off the top NFET 225. Moreover, when switch 305 is closed, DVdd is applied to the gate of the bottom NFET 230, thereby turning on the bottom NFET 230. In this manner, the middle junction control circuit 250' operates to turn off the top NFET 225 and turn on the bottom NFET 230 during an ESD event, which is the preferred state during an ESD event according to FIG. 6. On the other hand, during normal operation (e.g., non-ESD event), the switches 280, 305 are open due to the high state of Vdd, such that the middle junction control circuit 250' does not bias either the middle junction 285 or the gate of the bottom NFET 230.

Implementations of the method may be used to provide a robust 2.5V ESD protection circuit for 5V tolerant and fail-safe designs. Implementations of the invention may be used to improve the HBM ESD protection level up to 2500V for 5V-tolerant/fail-safe I/Os. Also, implementations can be used for both self-protected and non-self-protected I/O output configurations. Furthermore, embodiments provide the enhanced ESD performance without the need for an additional silicide-block region between gates of the stack device, thereby providing a smaller foot print and I/O size. Still further, embodiments can be implemented without additional process changes (e.g., without the need for extra masks, additional doping, etc.). Moreover, the tunable control voltage, via optional diodes, permits use in other output configurations.

Design Structure

Figure 10:
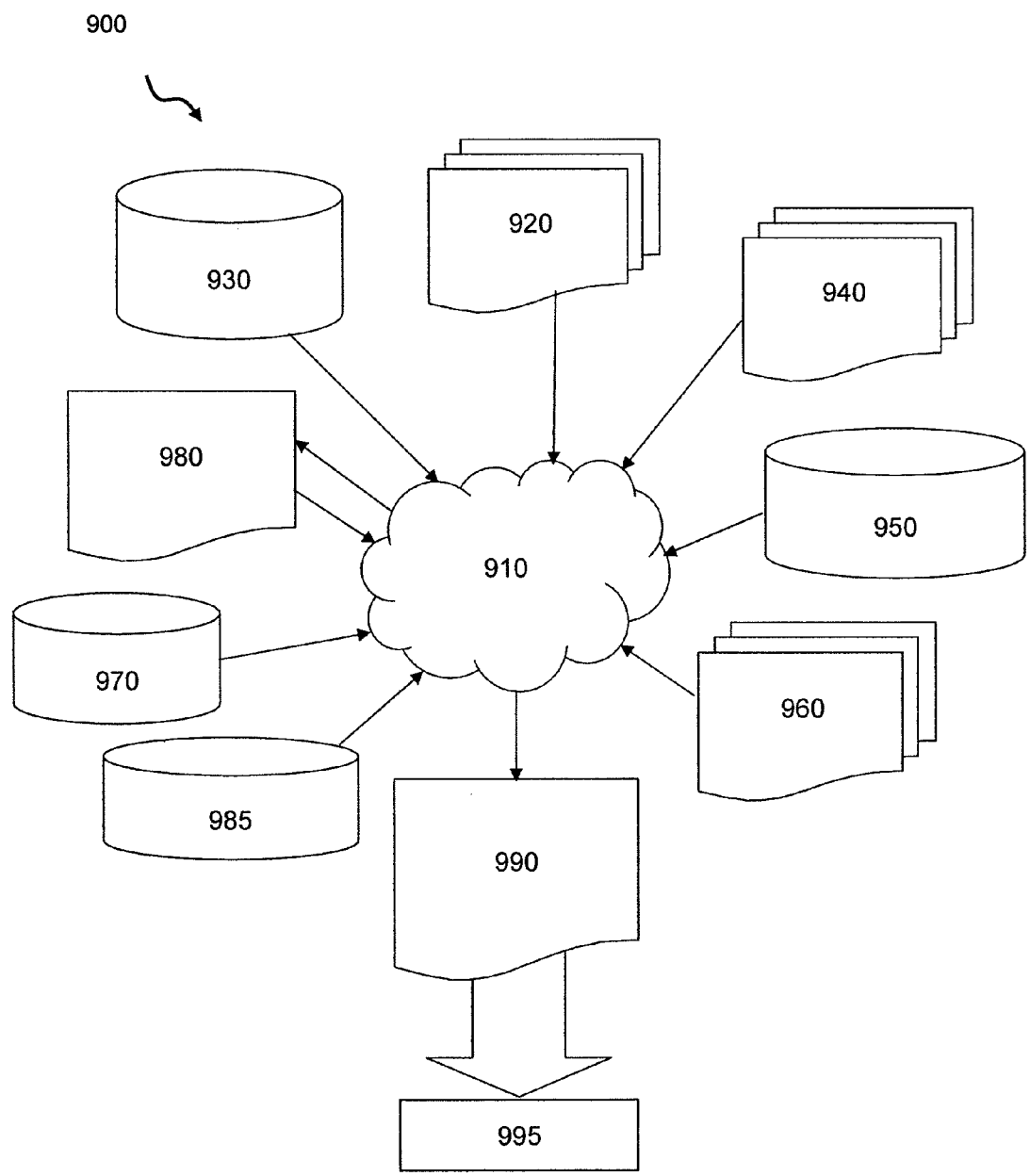
FIG. 10 is a flow diagram of a design process used in semiconductor design, manufacture, and/or test.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 8-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 8-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 8-10. In one embodiment, design structure 990 may comprise a compiled, executable HDL simulation model that functionally simulates the devices shown in FIGS. 8-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 8-10. Design structure 990 may then proceed to a stage 995 where, for example, design structure 990: proceeds to tape-out, is released to manufacturing, is released to a mask house, is sent to another design house, is sent back to the customer, etc.

The methods and/or design structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A circuit, comprising:
a middle junction control circuit that turns off a top NFET of a stacked NFET electrostatic discharge (ESD) protection circuit during an ESD event, wherein the middle junction control circuit turns off the top NFET by biasing a middle junction between the top NFET and a bottom NFET to substantially a same voltage as a gate of the top NFET.

2. The circuit of claim 1, wherein the stacked NFET ESD protection circuit comprises the top NFET and the bottom NFET arranged in series between an I/O pad and ground.

3. The circuit of claim 2, wherein the stacked NFET ESD protection circuit comprises:
a top resistor in series between the I/O pad and the top NFET;
a bottom resistor in series between the bottom NFET and ground; and
the middle junction between the top NFET and the bottom NFET, wherein the middle junction is connected to a source of the top NFET.

4. The circuit of claim 3, wherein, during operation other than the ESD event, the middle junction control circuit permits the middle junction to float.

5. The circuit of claim 1, wherein:
the middle junction control circuit comprises an inverter and a switch;
the inverter has a first voltage as an input; and
the switch has an output of the inverter as a switch input, wherein the output of the switch is connected to the middle junction between the top NFET and the bottom NFET of the stacked NFET ESD protection circuit.

6. The circuit of claim 5, wherein the middle junction is connected to a source of the top NFET.

7. The circuit of claim 6, wherein:
the switch is closed when the first voltage is in a low state;
the middle junction and the gate of the top NFET receive a second voltage when the switch is closed;
the switch is open when the first voltage is in a high state; and
the middle junction is permitted to float when the switch is open.

8. The circuit of claim 7, wherein:
the first voltage is Vdd, and
the second voltage is DVdd.

9. The circuit of claim 5, wherein:
the middle junction control circuit comprises a second switch;
an input of the second switch is connected to the output of the inverter; and
an output of the second switch is connected to a gate of the bottom NFET of the stacked NFET ESD protection circuit.

10. The circuit of claim 9, wherein the middle junction control circuit turns on the bottom NFET during the ESD event.

11. The circuit of claim 5, wherein the middle junction control circuit further comprises at least one diode that adjusts DVdd during the ESD event, the at least one diode being located between a DVdd source and the inverter and the switch.

12. A circuit, comprising:
a stacked NFET ESD protection circuit comprising a top NFET and a bottom NFET arranged in series between an I/O pad and ground; and
a middle junction control circuit that turns off the top NFET during an ESD event, wherein the middle junction control circuit comprises an inverter and a switch, wherein the middle junction control circuit at least partially turns on the bottom NFET during the ESD event.

13. The circuit of claim 12, wherein:
an input of the inverter is tied to a first power supply;
an output of the inverter is tied to a gate of the switch;
an input of the switch is tied to a second power supply;
a gate of the top NFET is tied to the second power supply; and
an output of the switch is tied to a source of the top NFET via a middle junction between the top NFET and the bottom NFET.

14. The circuit of claim 13, wherein:
the middle junction control circuit comprises a second switch;
a gate of the second switch is tied to the output of the inverter;
an input of the second switch is tied to the second power supply; and
an output of the second switch is tied to a gate of the bottom NFET.

15. The circuit of claim 13, further comprising at least one diode arranged between the second power supply and the middle junction control circuit.

16. The circuit of claim 13, wherein:
the first power supply is Vdd, and
the second power supply is DVdd.

17. A method of providing electrostatic discharge protection, comprising:
during an ESD event, turning off a top NFET of a stacked NFET ESD protection circuit by biasing a middle junction between the top NFET and a bottom NFET to substantially a same voltage as a gate of the top NFET.

18. The method of claim 17, further comprising turning on the bottom NFET during the ESD event.

19. The method of claim 17, further comprising tuning the voltage using at least one diode.

20. A design structure embodied in a tangible machine readable medium for designing, manufacturing, or testing an integrated circuit, the design structure comprising:
a middle junction control circuit that turns off a top NFET of a stacked NFET electrostatic discharge (ESD) protection circuit during an ESD event, wherein the middle junction control circuit turns off the top NFET by biasing a middle junction between the top NFET and the bottom NFET to substantially a same voltage as a gate of the top NFET.

21. The design structure of claim 20, wherein the design structure comprises a netlist.

22. The design structure of claim 20, wherein the design structure resides on storage medium as a data format used for the exchange of layout data of integrated circuits.

23. The design structure of claim 20, wherein the design structure resides in a programmable gate array.

24. The method of claim 17, wherein the biasing is performed by a control circuit comprising an inverter and a switch connected between the middle junction and the gate of the top NFET.

25. The circuit of claim 1, wherein an output of a switch is connected to the middle junction between the top NFET and the bottom NFET of the stacked NFET ESD protection circuit.

* * * * *